United States Patent
Zhang et al.

(10) Patent No.: US 11,662,413 B2
(45) Date of Patent: May 30, 2023

(54) MAGNETIC RESONANCE IMAGING METHOD AND DEVICE BASED ON BALANCED STEADY STATE FREE PRECESSION SEQUENCE

(71) Applicant: Siemens Healthcare GmbH, Erlangen (DE)

(72) Inventors: Qiong Zhang, Shenzhen (CN); Shao Rui Li, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/482,815

(22) Filed: Sep. 23, 2021

(65) Prior Publication Data

US 2022/0091213 A1    Mar. 24, 2022

(30) Foreign Application Priority Data

Sep. 24, 2020 (CN) .......................... 202011012587.X

(51) Int. Cl.
*G01R 33/561* (2006.01)
*G01R 33/56* (2006.01)
*G01R 33/48* (2006.01)

(52) U.S. Cl.
CPC ..... *G01R 33/5614* (2013.01); *G01R 33/4824* (2013.01); *G01R 33/5607* (2013.01)

(58) Field of Classification Search
CPC ............ G01R 33/5614; G01R 33/4824; G01R 33/5607; G01R 33/56563; G01R 33/4818; G01R 33/561; G01R 33/565; A61B 5/055
See application file for complete search history.

(56) References Cited

U.S. PATENT DOCUMENTS 7,474,097 B2 * 1/2009 Bydder .............. G01R 33/4816
324/309
2017/0102439 A1 * 4/2017 McMillan .......... G01R 33/4816
(Continued)

FOREIGN PATENT DOCUMENTS

RU        2584130 C1    5/2016

OTHER PUBLICATIONS

Scheffler, Klaus, and Philipp Ehses. "High-resolution mapping of neuronal activation with balanced SSFP at 9.4 tesla." Magnetic resonance in medicine 76.1 (2016): 163-171. (Year: 2016).*
(Continued)

*Primary Examiner* — Rishi R Patel
(74) *Attorney, Agent, or Firm* — Banner & Witcoff Ltd.

(57) ABSTRACT

Techniques are disclosed based on balanced steady state free precession sequence. The techniques include determining a readout gradient of climbing period, platform period, and descent period, and performing a balanced steady state free precession sequence in which the readout gradient is applied in the readout direction, the analog-to-digital conversion module for collecting k-space data is activated during the climbing period maintained in the on state during the platform period, and deactivated during the descent period. The technique includes converting the k-space data collected by the analog-to-digital conversion module into uniform k-space data and generating a magnetic resonance image based on the uniform k-space data. The techniques yield more running time of the readout gradient for data acquisition, reduce the data reading time, and shorten the scanning time. The techniques also reduce the accumulated phase of the field non-uniformity in the echo interval to reduce black band artifacts.

9 Claims, 7 Drawing Sheets

(56) References Cited

U.S. PATENT DOCUMENTS

2017/0219672 A1* 8/2017 Miyazaki .......... G01R 33/5635
2019/0018098 A1   1/2019 Schmitt et al.

OTHER PUBLICATIONS

Ehses, Philipp, and Klaus Scheffler. "Multiline balanced SSFP for rapid functional imaging at ultrahigh field." Magnetic Resonance in Medicine 79.2 (2018): 994-1000. (Year: 2018).*

* cited by examiner

MAGNETIC RESONANCE IMAGING METHOD AND DEVICE BASED ON BALANCED STEADY STATE FREE PRECESSION SEQUENCE

CROSS-REFERENCE TO RELATED APPLICATIONS

The present application claims the benefit of the filing date of China patent application no. CN 202011012587.X, filed on Sep. 24, 2020, the contents of which are incorporated herein by reference in their entirety.

TECHNICAL FIELD

The disclosure relates to the technical field of magnetic resonance imaging and, in particular, to a magnetic resonance imaging method and device based on a balanced steady state free precession sequence.

BACKGROUND

With the development of computer technology, electronic circuit technology, and superconductor technology, magnetic resonance imaging (MRI) is a kind of biomagnetic nuclear spin imaging technology. It makes use of magnetic field and radio frequency pulse to make the hydrogen nucleus (H+) in human tissue vibrate to produce a radio frequency signal, which is processed and imaged by computer. By placing an object in a magnetic field and illuminating the object with appropriate electromagnetic waves to make it resonate, and then analyzing the electromagnetic wave released by it, the position and type of the atomic nucleus constituting the object can be known. The accurate stereo image of the object can thus be determined accordingly.

Balanced Steady-State Free Precession (bSSFP), also known as a True Fast Imaging with Steady State Precession (TrueFISP) sequence or a Trufi sequence, can rapidly image with a high signal-to-noise ratio. In the balanced steady-state free precession sequence, the balanced gradient pulse shape is used. The balanced steady-state free precession sequence can work well with balanced gradient moment in a short repetition time (TR), in which the banding artifacts caused by BO inhomogeneity can be reduced by short repetition time.

In the current balanced steady-state free precession sequence, the k-space data is only collected in the platform period when the gradient is read out, but not in the climbing and descent periods, which leads to the increase of scanning time.

SUMMARY

The embodiments of the disclosure are directed to a magnetic resonance imaging method and device based on the balanced steady-state free precession sequence.

The technical scheme of the embodiments of the disclosure is as follows:

A magnetic resonance imaging method based on balanced steady-state free precession sequence includes:

Determining a readout gradient including a climbing period, a platform period, and a descent period;

Performing a balanced steady state free precession sequence in which the readout gradient is applied in the readout direction, the analog-to-digital conversion module for collecting k-space data is opened (i.e. switched on, active, or actively collecting data) during the climbing period, the analog-to-digital conversion module is kept in the on state during the platform period, and the analog-to-digital conversion module is closed (i.e. switched off, deactivated, or no longer actively collecting data) during the descent period;

Converting the k-space data collected by the analog-to-digital conversion module into uniform k-space data;

A magnetic resonance image is generated based on the uniform k-space data.

Therefore, in an embodiment of the disclosure, the analog-to-digital conversion module is turned on during the climbing period of the readout gradient, and then the analog-to-digital conversion module is turned off during the descent period of the readout gradient, so that more running time of the read-out gradient can be used for data acquisition, the data reading time is reduced, and the scanning time is shortened. Moreover, since the data reading time is reduced, the embodiment of the disclosure also reduces the accumulated phase of field non-uniformity in each echo interval, and can also reduce the black band artifact.

In one embodiment, determining a readout gradient including a climbing period, a platform period, and a descent period includes:

The on time ADC of the analog-to-digital conversion module is determined based on the sampling bandwidth of the reconstruction points in the readout direction;

The readout gradient $G_5$ with symmetrical shape is determined, where:

$$\gamma \int_0^{ADC} G_5 dt = \frac{N}{FOV};$$

$$\mathrm{mod}(\mathrm{time}_{G5}, gradRaster) = 0;$$

Where $\gamma$ is Planck constant, N is the number of reconstruction points in the readout direction, FOV is the field of view, $\mathrm{time}_{G5}$ is the time length of readout gradient $G_5$, mod is the remainder function, gradRaster is the gradient grid time, dt is the differential of time t, and f is integral symbol.

Therefore, an embodiment of the disclosure can quickly determine the readout gradient based on the integral constraint conditions.

In one embodiment, the activation or on time of the analog-to-digital conversion module is represented as ADC and is 2N times of the gradient grid time gradRaster, the readout gradient $G_5$ is such that the gradient length is equal to a dimension of an isosceles trapezoid (that represents a time profile as disused herein) represented by the on time ADC; where N is a positive integer.

Therefore, when the on time ADC of the analog-to-digital conversion module is 2N times of the gradient grid time gradRaster, the gradient length of the readout gradient is the on time of the analog-to-digital conversion module, so the readout gradient can be quickly determined.

In one embodiment, when the on time ADC of the analog-to-digital conversion module is not 2N times of the gradient grid time gradRaster, the determined readout gradient $G_5$ includes:

Determining the minimum value $ADC_{virtual}$ of a virtual on time $ADC_{vir}$ of the analog-to-digital conversion module, where, $ADC_{vir}$ is larger than the on time ADC of the analog-to-digital conversion module, and mod ($ADC_{vir}$−ADC, 2*gradRaster)=0;

Based on $$\gamma \int_0^{ADC_{virtual}} G_{5temp} dt = \frac{ADC_{virtual}}{ADC} * \frac{N}{FOV},$$

determine a temporary readout gradient $G_{5temp}$, where $G_{5temp}$ is represented as an isosceles trapezoid time profile having a bottom length equal to $ADC_{virtual}$;

The amplitude of the temporary readout gradient $G_{5temp}$ is reduced so that the product of integral of $G_{5temp}$ in the on time ADC of analog-to-digital conversion module and $\gamma$ is equal to $$\frac{N}{FOV};$$

The $G_{5temp}$ with reduced amplitude is determined as the readout gradient $G_5$, where N is a positive integer.

Therefore, when the on time ADC of the analog-to-digital conversion module is not 2N times of the gradient grid time gradRaster, the readout gradient can be accurately determined by determining the minimum virtual turn-on time, and then reducing the amplitude of the temporary readout gradient by using integral constraints.

A magnetic resonance imaging device based on balanced steady-state free precession sequence includes:

A readout gradient determination module for determining a readout gradient including a climb period, a platform period, and a descent period;

An analog-to-digital conversion module for collecting k-space data after being turned on;

A sequence execution module for performing a balanced steady state free precession sequence, wherein the readout gradient is applied in the readout direction, the analog-to-digital conversion module is on during the climbing period, the analog-to-digital conversion module is kept in the open state during the platform period, and the analog-to-digital conversion module is closed during the descent period;

A conversion module for converting the k-space data collected by the analog-to-digital conversion module into uniform k-space data;

An image generation module for generating a magnetic resonance image based on the uniform k-space data.

Therefore, in an embodiment of the disclosure, the analog-to-digital conversion module is turned on during the climbing period of the readout gradient, and then the analog-to-digital conversion module is turned off during the descent period of the readout gradient, so that more running time of the read-out gradient can be used for data acquisition, the data reading time is reduced, and the scanning time is shortened. Moreover, since the data reading time is reduced, the embodiment of the disclosure also reduces the accumulated phase of field non-uniformity in each echo interval, and can also reduce the black band artifact.

In one embodiment, the readout gradient determination module is used to determine the on time ADC of the analog-to-digital conversion module based on the sampling bandwidth of the reconstruction points in the readout direction; and to determine the readout gradient $G_5$ with symmetrical shape, where, $$\gamma \int_0^{ADC} G_5 dt = \frac{N}{FOV}; \text{mod}(time_{G5}, gradRaster) = 0;$$

where $\gamma$ is Planck constant; N is the number of reconstruction points in the readout direction; FOV is the field of view; $time_{G5}$ is the time length of the readout gradient $G_5$; and mod is the remainder function; gradRaster is the gradient grid time; dt is the differential of time t; $\int$ is integral symbol.

Therefore, the embodiment of the disclosure can quickly determine the readout gradient based on the integral constraint conditions.

In one embodiment, when the on time ADC of the analog-to-digital conversion module is 2N times of the gradient grid time gradRaster, the readout gradient $G_5$ has a gradient length equal to the bottom length of an isosceles trapezoid time profile representing the on time ADC; where N is a positive integer.

Therefore, when on time ADC of the analog-to-digital conversion module is 2N times of the gradient grid time gradRaster, the gradient length of the readout gradient is the on time of the analog-to-digital conversion module, so the readout gradient can be quickly determined.

In one embodiment, when the on time ADC of the analog-to-digital conversion module is not 2N times of the gradient grid time gradRaster, the readout gradient determination module is used to determine the minimum value $ADC_{virtual}$ of the virtual on time $ADC_{vir}$ of the analog-to-digital conversion module, where, $ADC_{vir}$ is greater than the on time ADC of the analog-to-digital conversion module, and mod $(ADC_{vir}-ADC, 2*gradRaster)=0$; based on the $$\gamma \int_0^{ADC_{virtual}} G_{5temp} dt = \frac{ADC_{virtual}}{ADC} * \frac{N}{FOV},$$

the temporary readout gradient $G_{5temp}$ is determined, where $G_{5temp}$ is represented by an isosceles trapezoid time profile bottom length and is equal to $ADC_{virtual}$; the amplitude of the temporary readout gradient $G_{5temp}$ is reduced so that the product of the integral of $G_{5temp}$ in the on time ADC of the analog-to-digital conversion module and $\gamma$ is equal to $$\frac{N}{FOV};$$

the $G_{5temp}$ with reduced amplitude is determined as the readout gradient $G_5$; where N is a positive integer.

Therefore, when the on time ADC of the analog-to-digital conversion module is not 2N times of the gradient grid time gradRaster, the readout gradient can be accurately determined by determining the minimum virtual turn-on time, and then reducing the amplitude of the temporary readout gradient by using integral constraints.

A control host of a magnetic resonance imaging system is provided and includes a memory and a processor, in which an application program which can be executed by the processor is stored in the memory to enable the processor to execute the magnetic resonance imaging method based on the balanced steady-state free precession sequence as described herein and in the claims.

It can be seen that the implementation mode of the disclosure also proposes a control host of a magnetic resonance imaging system with a memory-processor architecture, which can shorten the scanning time and reduce the black band artifacts.

A computer-readable storage medium on which a computer program is stored, and when the computer program is executed by a processor, a magnetic resonance imaging method based on a balanced steady-state free precession sequence as described herein is realized.

It can be seen that the embodiment of the disclosure also provides a computer-readable storage medium containing a computer program. When the computer program is executed, the scanning time can be shortened and the black band artifact can be reduced.

BRIEF DESCRIPTION OF THE DRAWINGS/FIGURES

| | |
|---|---|
| 1 | Pre-dephase gradient |
| 2 | Readout gradient |
| 3 | Refocusing phase gradient |
| 14 | Analog-to-digital conversion module |
| 200 | A magnetic resonance imaging method based on balanced steady-state free precession sequence |
| 201~204 | Steps |
| 31 | Readout gradient |
| 41 | Readout gradient |
| 42, 43 | Triangle |
| 51 | Temporary readout gradient $G_{Stemp}$ |
| 52 | Minimum value $ADC_{virtual}$ of virtual on time of the analog-to-digital conversion module |
| 53 | $G_{Stemp}$ with reduced amplitude |
| 4 | Pre-dephase gradient |
| 5 | Readout gradient |
| 6 | Refocusing phase gradient |

-continued

| | |
|---|---|
| 81, 82, 83, 84 | Subpicture |
| 91, 92, 93 | Subpicture |
| 1001, 1002, 1003, 1004 | Subpicture |
| 300 | A magnetic resonance imaging device based on balanced steady-state free precession sequence |
| 301 | Readout gradient determining module |
| 302 | Analog-to-digital conversion module |
| 303 | Sequence execution module |
| 304 | conversion module |
| 305 | Image generation module |
| 400 | Control host of Magnetic Resonance Imaging System |
| 401 | Memory |
| 402 | Processor |

DETAILED DESCRIPTION

In order to make the technical scheme and advantages of the disclosure clearer and clearer, the present disclosure is further described in detail in combination with the drawings and the implementation mode. It should be understood that the specific embodiments described herein are for illustrative purposes only and are not intended to limit the scope of protection of the disclosure.

In order to be concise and intuitive in description, the scheme of the disclosure is described in the following by describing several representative embodiments. A large number of details in the embodiments are used to help understand the solutions of the disclosure. However, it is obvious that the implementation of the technical scheme of the disclosure may not be limited to these details. In order to avoid unnecessarily blurring the scheme of the disclosure, some embodiments are not described in detail, but only the framework is given. Hereinafter, "including" means "including, but not limited to," and "according to . . . " means "At least according to . . . , but not limited to only according to . . . ". Due to the language habit of Chinese, when the number of a component is not specified in the following, it means that the component can be one or more, or can be understood as at least one.

The Applicant has found that in the conventional use of the balanced steady-state free precession sequence, the k-space data is only collected during the platform or plateau period when the gradient is read out, and the k-space data is not collected in the climbing (i.e. rising or rise time) and descent (i.e. falling or fall time) periods, which results in the data reading time being too long, thus increasing the scanning time.

Figure 1:
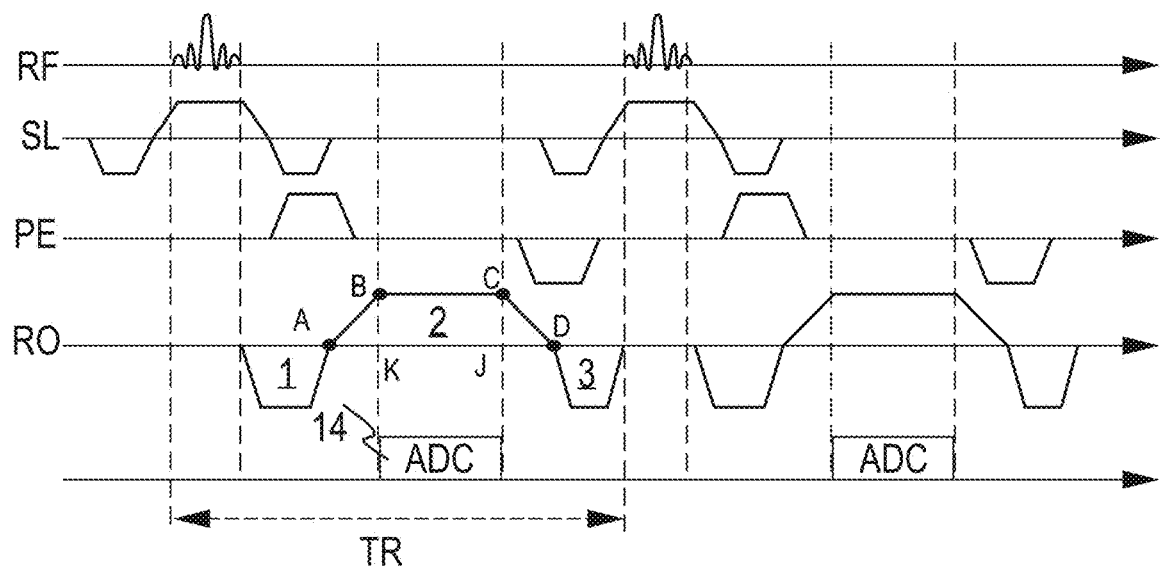
FIG. 1 is an execution diagram of the balanced steady-state free precession sequence as known in the art.

FIG. 1 is the execution diagram of the balanced steady-state free precession sequence as known in the art. In FIG. 1, radio frequency (RF) pulses, layer selection gradient (SL), phase encoding (PE), and readout direction (RO) are shown from top to bottom, respectively. In the readout direction, the pre-dephase gradient 1 is applied before the readout gradient 2, then the readout gradient 2 is applied, and the refocusing phase gradient 3 is applied after the readout gradient 2. The shape of the readout gradient 2 is a time profile represented by an isosceles trapezoid ABCD, i.e. an isosceles trapezoid having segments connected to the points in time on the graph as shown that are denoted by A, B, C, and D. The readout gradient 2 includes a climbing period, a platform period (i.e. a plateau, constant, or stable period), and a descent period. The climbing period is shown by the line AB extending upward from point A to point B, the period of platform is shown by the line BC extending horizontally from point B to point C, and the period of descent is shown by the line CD extending downward from point C to point D.

In FIG. 1, the conventional use of the analog-to-digital conversion (ADC) module 14 is turned on to collect k-space data only during the platform period of the read-out gradient 2, while the analog-to-digital conversion module 14 is turned off without collecting k-space data during the climbing and descent periods of the readout gradient 2. Therefore, k-space data is only collected during part of the running time of the read-out gradient 2, which results in the data read time being too long and the scanning time increased.

The embodiments discussed in accordance with the disclosure propose to implement ramp-sampling in the balanced steady-state free precession sequence, i.e. to turn on the ADC module in the climbing period, and then turn off the ADC module in the descent period, so as to use more running time of the readout gradient for data acquisition, reduce the data reading time, and shorten the scanning time. Moreover, since the data read time is reduced, the embodiment of the disclosure can also reduce the accumulated phase of field non-uniformity in each echo interval, thus reducing the black band artifacts.

The embodiment of the disclosure proposes a flow chart of magnetic resonance imaging method based on balanced steady-state free precession sequence.

Figure 2:
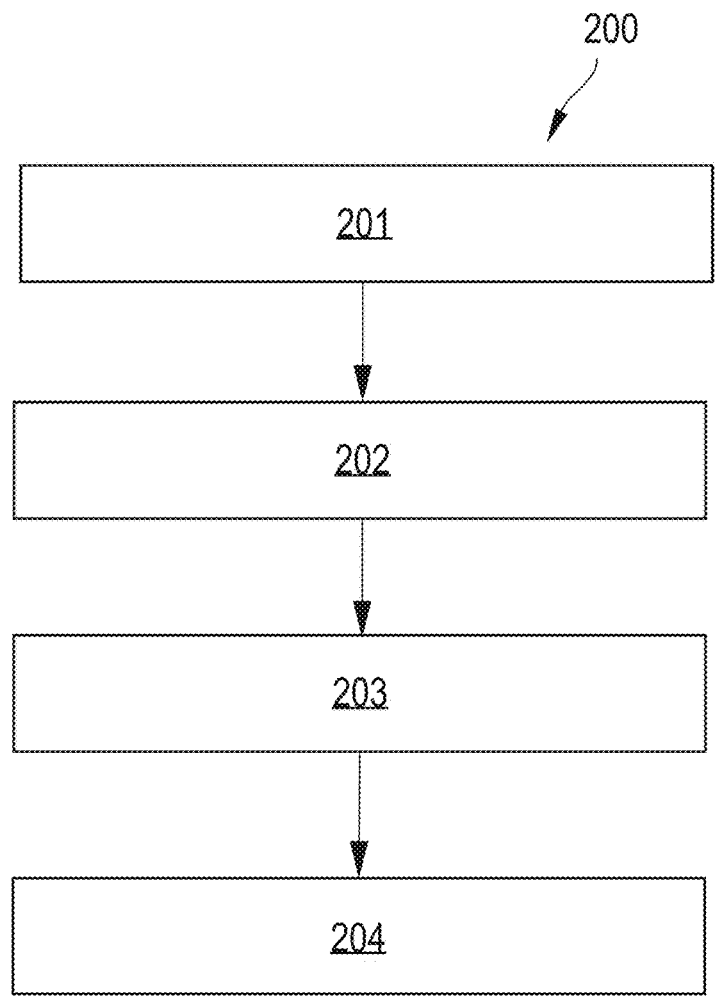
FIG. 2 is a flow chart of a magnetic resonance imaging method based on a balanced steady-state free precession sequence according to an embodiment of the present disclosure.

As shown in FIG. 2, a magnetic resonance imaging method 200 based on a balanced steady-state free precession sequence and includes:

Step 201: determining a readout gradient including a climbing period, a platform period, and a descent period;

In one embodiment, in step 201, the readout gradient including climbing period, platform period, and descent period is determined, including: determining the on time ADC of the analog-to-digital conversion module based on the sampling bandwidth of the reconstruction point in the readout direction, and determining the readout gradient G5 with symmetrical shape, wherein:

$$\gamma \int_0^{ADC} G_5 dt = \frac{N}{FOV};$$ (Formula 1), mod(time$_{G5}$, gradRaster)=0; (Formula 2), where γ is Planck constant; N is the number of reconstruction points in the readout direction; FOV is the field of view; time$_{G5}$ is the time length of readout gradient G$_5$; mod is the remainder function; gradRaster is the gradient grid time; dt is the differential of time t The integral symbol is generally understood as such. Thus, the readout gradient G$_5$ may have a shape on the timing graph that corresponds to a time profile represented by an isosceles trapezoid.

Specifically, the on time (i.e. the duration of the on state) of the analog-to-digital conversion module can be determined by the user based on the protocol parameters.

For example, $$ADC = \frac{1}{BW_{pixel}};$$ (formula 3), where BW$_{pixel}$ is the sampling bandwidth of reconstruction points in the readout direction.

It can be seen that the embodiment of the disclosure can quickly determine the readout gradient based on the integral constraint conditions.

Step 202: performing a balanced steady state free precession sequence, in which the readout gradient is applied in the readout direction, the analog-to-digital conversion module for collecting k-space data is turned on during the climbing period, the analog-to-digital conversion module is kept in the on state during the platform period, and the analog-to-digital conversion module is turned off during the descent period.

Therefore, unlike in the conventional usage, k-space data is only collected in the platform period of reading the gradient, but the k-space data is not collected in the climbing period and the descent period. In an embodiment of the disclosure, a slope sampling mode is adopted as follows: during the climbing period, the analog-to-digital module used to collect k-space data is turned on; during the platform period the analog-to-digital conversion module is kept in the on state to continuously collect k-space data, and during the descent period the analog-to-digital conversion module is turned off so as to stop collecting k-space data. Thus, more running time of reading gradient can be used for data acquisition.

Specifically, considering the gradient symmetry requirement of the balanced steady-state free precession sequence, the analog-to-digital conversion module for collecting k-space data is turned on at the first time point in the climbing period, during the platform period the analog-to-digital conversion module is kept in the on state, and the analog-to-digital conversion module is turned off at the second time point in the descent period, where the distance between the first time point and the platform period center is equal to the distance between the second time point and the platform period center. The first time point can be any point in the climbing period, such as the starting point of the climbing period. The second time point can be any point in the descent period, such as the end of the descent period. The difference between the second time point and the first time point is the on time of the analog-to-digital conversion module (within a sampling period) determined based on the sampling bandwidth of the reconstruction point in the readout direction, and the integral of the readout gradient between the first time point and the second time point is equal to $$\frac{N}{FOV},$$

so as to ensure that the readout gradient of the embodiment of the disclosure has the same first momentum as the readout gradient of the conventional means.

Step 203: convert the k-space data collected by the analog-to-digital conversion module into uniform k-space data.

Here, considering that the slope sampling method adopted in step 202 is non-uniform acquisition, the k-space data collected by the analog-to-digital conversion module is converted into uniform k-space data in step 203, so that the magnetic resonance image can be generated based on the uniform k-space data in the subsequent step 204.

Specifically, in step 203, an interpolation algorithm can be applied to re-sample the k-space data collected by the analog-to-digital conversion module into uniform k-space data.

For example, interpolation algorithms can include: spatial interpolation algorithms; block interpolation algorithms; polynomial interpolation algorithms; spline function algorithms; bilinear interpolation algorithms; fitting polynomial algorithms; spline function interpolation algorithms; multi-layer overlay surface interpolation algorithms; least squares collocation method interpolation algorithms; point by point interpolation algorithms; weighted average interpolation algorithms; moving fitting algorithms; interpolation algorithms; interpolation algorithms; interpolation algorithms; global interpolation algorithms; high-order polynomial interpolation algorithms, etc.

The above exemplary description describes a typical example of the interpolation algorithm, and those skilled in the art can realize that this description is only exemplary and is not used to limit the implementation mode of the disclosure.

Step 204: generate magnetic resonance images based on uniform k-space data.

In this paper, Fourier transform of uniform k-space data can decode the spatial location coding information in the original data and decompose the magnetic resonance signals with different frequencies, phases, and amplitudes. Different frequencies and phases represent different spatial positions, while different amplitudes represent different strength of magnetic resonance signals. The magnetic resonance image data can be obtained by distributing the magnetic resonance digital signals with different frequency, phase, and signal strength into the corresponding pixels.

The flow shown in FIG. 2 can be further combined with image de-noising algorithms (such as offline noise-reduction algorithm), so that not only can the scanning time and artifacts be reduced, but also the image quality will not be significantly reduced.

In one embodiment, when the on time ADC of the analog-to-digital conversion module is 2N times of the gradient grid time gradRaster, it is determined in step 201 that the mutual readout gradient $G_5$ is: the length represented by the ADC on time corresponding to bottom length of the isosceles trapezoid, where N is a positive integer. Among these: when the on time ADC of the analog-to-digital conversion module is 2N times of the gradient grid time gradRaster, the bottom length of the readout gradient can be exactly equal to the on time ADC. Therefore, the specific parameters of the time profile represented by the isosceles trapezoid, such as the length of the upper side (parallel to the longest bottom side), as well as the length of the other sides, can be quickly calculated based on the above formula 1.

Figure 3:
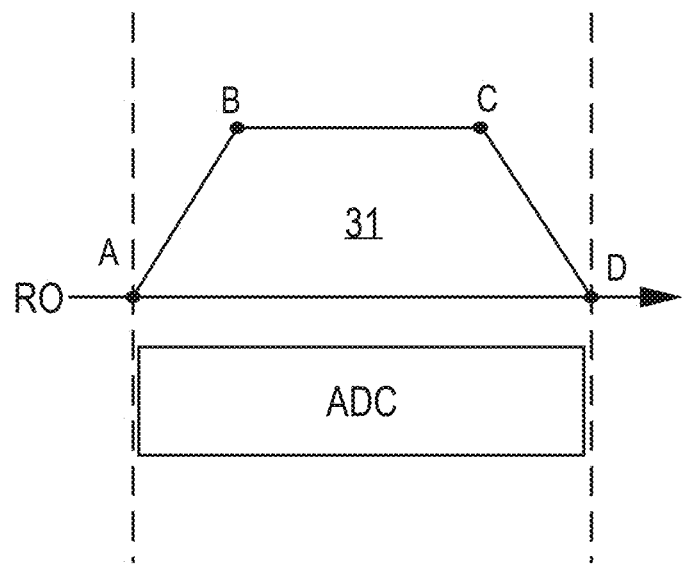
FIG. 3 is a first exemplary schematic diagram of a readout gradient according to an embodiment of the present disclosure.

FIG. 3 is a first exemplary schematic diagram of a readout gradient according to an embodiment of the present disclosure. When the on time ADC of analog-to-digital conversion module is 2N times of the gradient grid time gradRaster, the gradient length of the readout gradient 31 is exactly the same as the on time ADC. It can be seen from FIG. 3 that the readout gradient 31 has a time profile that is represented as an isosceles trapezoid shape (as shown in FIG. 3, the isosceles trapezoid ABCD), in which the bottom length AD, i.e. the gradient length, is equal to the on time ADC. Moreover, the area of the isosceles trapezoid ABCD time profile (the integral of the readout gradient 31 on the ADC of the on time) represents the first moment of the readout gradient 31, which satisfies Formula 1.

When the on time ADC of analog-to-digital conversion module is not 2N times of the gradient grid time gradRaster, the length of the readout gradient cannot be exactly equal to the on time ADC. Therefore, it is necessary to remove the same area on the left and right sides of the readout gradient. Moreover, the area of the remaining area after part of the left and right sides being removed needs to meet Formula 1.

Figure 4:
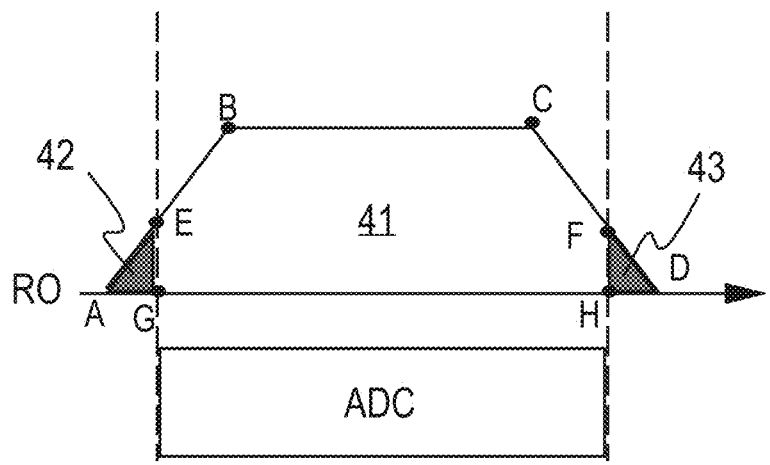
FIG. 4 is a second exemplary schematic diagram of a readout gradient according to an embodiment of the present disclosure.

FIG. 4 is a second exemplary schematic diagram of a readout gradient according to an embodiment of the present disclosure.

When the on time ADC of analog-to-digital conversion module is not 2 N times of the gradient grid time gradRaster, the length of readout gradient 41 cannot be exactly equal to the on time ADC. As can be seen from FIG. 4, the readout gradient 41 is represented as a time profile corresponding to an isosceles trapezoid shape ABCD, in which the bottom length AD is greater than the on time ADC. The on time point of analog-to-digital conversion module is E, and the off time point of analog-to-digital conversion module is E. In the AE period of the readout gradient 41, the analog-to-digital conversion module is not turned on, while in the FD time period of reading gradient 41, the analog-to-digital conversion module is turned on.

Therefore, the readout gradient 41 also includes mutually-symmetrical triangles 42 and 43. Moreover, the product of the area of the remaining part of the isosceles trapezoid ABCD after the triangle 42 and the triangle 43 being removed (i.e. the polygon GEBCFH) (the integral of the readout gradient 41 on the on time ADC) and γ represents the first-order moment of the readout gradient 41, which needs to satisfy Formula 1.

The embodiments of the disclosure also provide a method for accurately determining the readout gradient when the on time of the analog-to-digital conversion module is not 2N times of the gradient grid time gradRaster.

In one embodiment, when the on time ADC of the analog-to-digital conversion module is not 2N times of the gradient grid time gradRaster, the determined readout gradient $G_5$ includes:

Determining the minimum value $ADC_{virtual}$ of the virtual on time $ADC_{vir}$ of the analog-to-digital conversion module, where $ADC_{vir}$ is larger than the on time ADC of the analog-to-digital conversion module, and mod ($ADC_{vir}$−ADC, 2*gradRaster)=0;

Based on $$\gamma \int_0^{ADC_{virtual}} G_{5temp} dt = \frac{ADC_{virtual}}{ADC} * \frac{N}{FOV},$$

the temporary readout gradient $G_{5temp}$ is determined, where $G_{5temp}$ is represented as the bottom length of the isosceles trapezoid equal to $ADC_{virtual}$;

The amplitude of the temporary readout gradient $G_{5temp}$ is reduced so that the product of integral of $G_{5temp}$ in the on time ADC of analog-to-digital conversion module and γ is equal to $$\frac{N}{FOV};$$

The $G_{5temp}$ with reduced amplitude is determined as the readout gradient $G_5$, where N is a positive integer.

Figure 5:
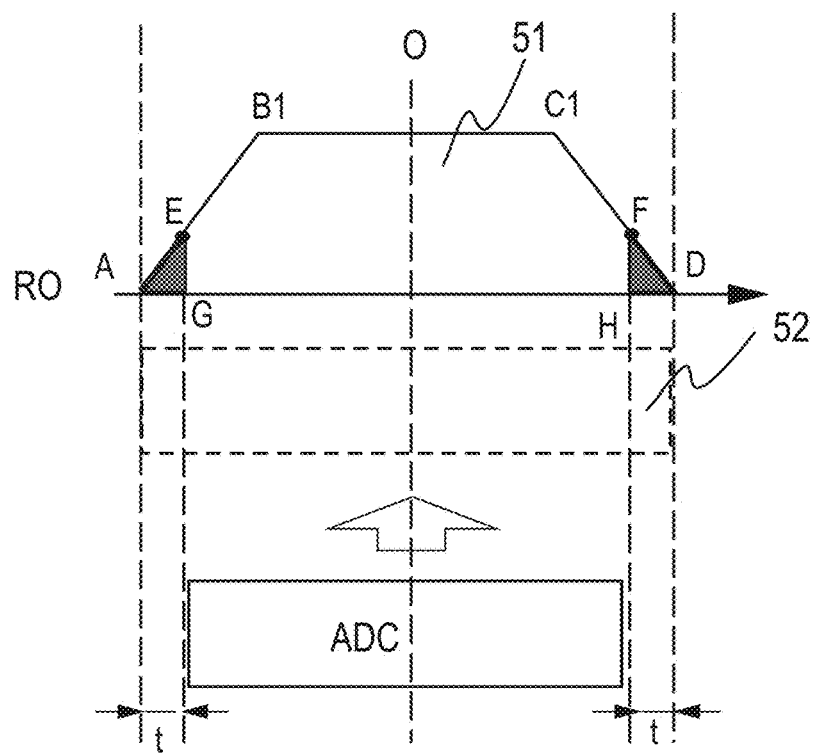
FIG. 5 is a first exemplary schematic diagram of process for determining the readout gradient according to an embodiment of the present disclosure.
Figure 6:
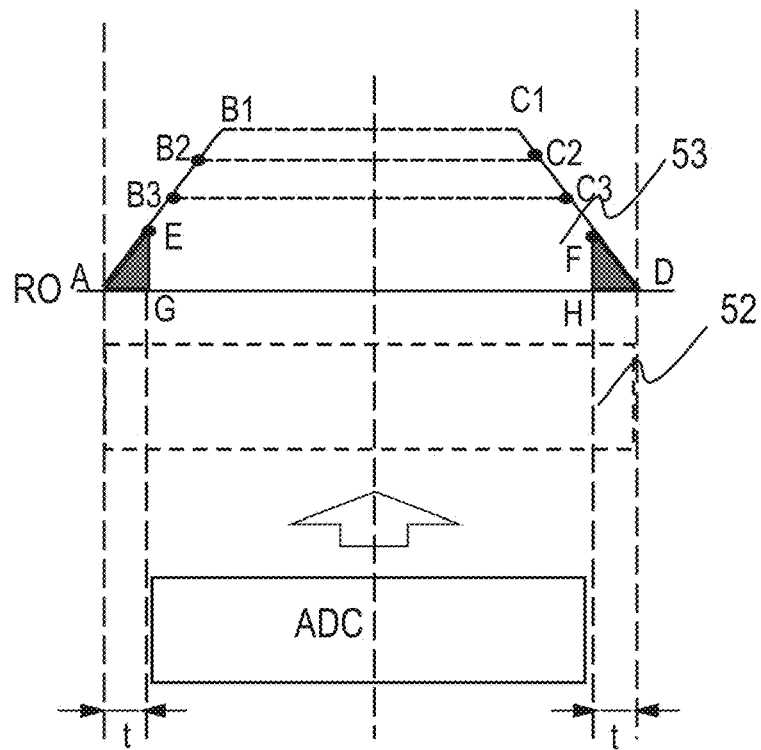
FIG. 6 is a second exemplary schematic diagram of process for determining the readout gradient according to an embodiment of the present disclosure.

FIG. 5 is a first exemplary schematic diagram of process for determining the readout gradient according to an embodiment of the present disclosure. FIG. 6 is a second exemplary schematic diagram of process for determining the readout gradient according to an embodiment of the present disclosure. Combined with the diagrams in FIG. 5 and FIG. 6, a method for accurately determining the readout gradient is described when the on time ADC of the analog-to-digital conversion module is not 2N times of the gradient grid time gradRaster.

First, a minimum value $ADC_{virtual}$ 52 of the virtual on time $ADC_{vir}$ of the analog-to-digital conversion module is determined. The virtual on time $ADC_{vir}$ of analog-to-digital conversion module meets the following two constraints: (1) $ADC_{vir}$ is longer than the on time ADC of analog-to-digital conversion module; (2) mod($ADC_{vir}$–ADC, 2*gradRaster)=0.

For example, it is assumed that the on time ADC of the analog-to-digital conversion module is 1254.4 microseconds (μ s), and gradRaster is 10 microseconds. Then, the minimum value $ADC_{virtual}$ virtual on time $ADC_{vir}$ is 1260 microseconds.

As can be seen from FIG. 5, $ADC_{virtual}$ 52 is slightly longer than the on time ADC. The on time point of analog-to-digital conversion module is E, and the off time point of analog-to-digital conversion module is F. On the readout (RO) axis, point G corresponds to the on time point E, and point H corresponding to the off time point F.

Therefore, on the left and right sides of the readout gradient 51, there are triangles beyond the on time ADC range, namely triangle AEG and triangle DFH.

Based on $$\gamma \int_0^{ADC_{virtual}} G_{5temp} dt = \frac{ADC_{virtual}}{ADC} * \frac{N}{FOV},$$

the temporary readout gradient $G_{5temp}$ 51 is determined, where the readout gradient time of $G_{5temp}$ 51 is represented as the bottom length of the isosceles trapezoid that is equal to $ADC_{virtual}$ 52. $G_{5temp}$ 51 is thus a time profile represented by the isosceles trapezoid AB1C1D.

Then, the amplitude of the temporary readout gradient $G_{5temp}$ is reduced so that the product of the $G_{5temp}$ integral in the on time ADC of the analog-to-digital conversion module and γ is equal to $$\frac{N}{FOV};$$

and then, the $G_{5temp}$ with the reduced amplitude is determined as the readout gradient $G_5$, where N is a positive integer.

For example, as shown in FIG. 6 as $$\frac{ADC_{virtual}}{ADC} > 1,$$

the product of the integral of isosceles trapezoid AB1C1D in the on time ADC of the analog-to-digital conversion module and γ is greater than $$\frac{N}{FOV}.$$

At this time, the amplitude of the temporary readout gradient $G_{5temp}$ is reduced, for example to the amplitude defined by B2C2. Then, a determination may be made whether the product of the integral of isosceles trapezoid AB2C2D in the on time ADC of the analog-to-digital conversion module and γ is equal to $$\frac{N}{FOV}.$$

If it is, the time profile represented by the isosceles trapezoid AB2C2D is determined as the readout gradient $G_5$. If not, the amplitude of the temporary readout gradient $G_{5temp}$ may be further reduced. It is assumed that when the product of integral (i.e. the area of polygon GEB2C2FH) of isosceles trapezoid AB2C2D in the on time ADC of the analog-to-digital conversion module and γ is still greater than $$\frac{N}{FOV},$$

the amplitude or me temporary readout gradient $G_{5temp}$ is continued to be reduced, for example, to the amplitude limited by B3C3. Then, a determination is made whether the product of the isosceles trapezoid AB3C3D integral (i.e. the area of polygon GEB3C3FH) in the on time ADC of the analog-to-digital conversion module and γ is equal to $$\frac{N}{FOV}.$$

If so, it is determined mat me time profile represented by the isosceles trapezoid AB3C3D is the readout gradient $G_5$.

The above exemplary description describes a typical example of determining the readout gradient, and those skilled in the art can realize that this description is only exemplary and is not used to limit the protection scope of the embodiment of the disclosure.

Figure 7:
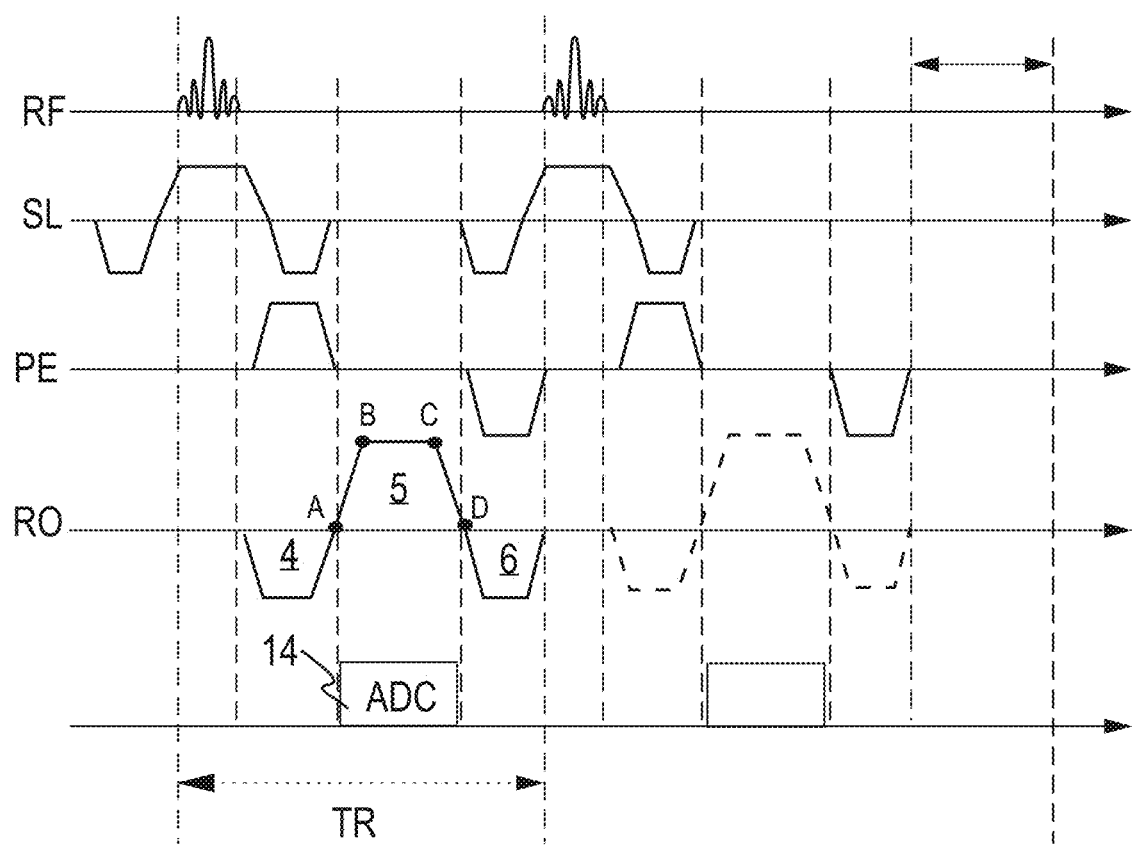
FIG. 7 is an exemplary execution diagram of a balanced steady-state free precession sequence according to an embodiment of the present disclosure.

An exemplary execution process of a balanced steady-state free precession sequence according to an embodiment of the present disclosure is described below. FIG. 7 is an exemplary execution diagram of a balanced steady-state free precession sequence according to an embodiment of the present disclosure. The first momentum of the readout gradient 5 in FIG. 7 is the same as that of the readout gradient 2 in FIG. 1.

In FIG. 7, radio frequency (RF) pulses, layer selection gradient (SL), phase encoding (PE), and readout direction (RO) are shown from top to bottom, respectively.

In FIG. 7, a RF excitation module is applied to flip the magnetization vector onto the X-Y plane. The RF excitation module includes RF excitation pulse and layer selection gradient. The angle of RF excitation pulse is input by the user, and the size of layer selection gradient is determined by the thickness of fault layer. Next, phase encoding is performed for the magnetization vector flipped to the X-Y plane. In the readout direction, the pre-dephase gradient 4 is applied before the readout gradient 5, then the readout gradient 5 is applied, and the refocusing phase gradient 6 is applied after the readout gradient 5. The shape of the readout gradient 5 is represented as a time profile associated with the isosceles trapezoid ABCD. The readout gradient 5 includes a climbing period, platform period, and descent period. The climbing period is shown by the line AB extending upward from point A to point B, the period of platform is shown by the line BC extending horizontally from point B to point C, and the period of descent is shown by the line CD extending downward from point C to point D.

In FIG. 7, at the starting point A during the rising period of the readout gradient 5, the analog-to-digital conversion module 14 is turned on to start collecting k-space data. During the whole platform period, the analog-to-digital conversion module 14 remains on to continuously collect k-space data, and at the end B of the descent period, the analog-to-digital conversion module 14 is turned off to stop collecting k-space data.

The following describes the determination process of readout gradient 5 ($G_5$) with specific algorithm First, the on time ADC of the analog-to-digital conversion module is determined, which can be determined by the user based on the protocol parameters. For example, $$ADC = \frac{1}{BW_{pixel}};$$

where $BW_{pixel}$ is the sampling bandwidth of the reconstruction points in the read-out direction.

According to the Bloch equation:

$$\gamma \int_0^{ADC} G_5 dt = \gamma \int_0^{ADC} G_2 dt \quad \text{(formula 4)};$$

Where, $G_2$ is the readout gradient 2 shown in FIG. 1. Since the amplitude of the readout gradient G2 is constant in the on time ADC of the analog-to-digital conversion module, the above formula 1 can be derived, i.e.

$$\gamma \int_0^{ADC} G_5 dt = \frac{N}{FOV}.$$

The readout gradient $G_5$ should satisfy the following constraints:

$$\gamma \int_0^{ADC} G_5 dt = \frac{N}{FOV}; \quad (1)$$

$$\text{mod}(\text{time}_{G5}, gradRaster) = 0; \quad (2)$$

(3) The readout gradient $G_5$ has a symmetrical shape.

Therefore, the process of determining the readout gradient $G_5$ includes: first, determining the on time of the analog-to-digital conversion module based on Formula 3, and then determining the first moment of the readout gradient $G_5$ (i.e., the product of the integral and γ on the on time of the analog-to-digital conversion module) based on Formula 1. Then:

(1) When the on time ADC of the analog-to-digital conversion module is 2N times of the gradient grid time gradRaster, the readout gradient $G_5$ can be determined as: a time profile represented by the isosceles trapezoid having a bottom length that is the on time ADC, so as to accurately determine the readout gradient $G_5$.

(2) When the on time ADC of analog-to-digital conversion module is not 2N times of the gradient grid time gradRaster, the set of virtual on time $ADC_{vir}$ is determined based on the following constraints (A) and (B).

Constraint condition (A): $ADC_{vir}$ is greater than the on time ADC of analog-to-digital conversion module;

Constraint condition (B): $\text{mod}(ADC_{vir} - ADC, 2*gradRaster) = 0$.

Then, the minimum value $ADC_{virtual}$ is determined from the set of virtual on time $ADC_{vir}$ satisfying the above constraints (A) and (B).

Next, the temporary readout gradient $G_{5temp}$ is determined based on $$\gamma \int_0^{ADC_{virtual}} G_{5temp} dt = \frac{ADC_{virtual}}{ADC} * \frac{N}{FOV}.$$

Then, the amplitude of the temporary readout gradient $G_{5temp}$ is reduced until the product of the integral and γ of $G_{5temp}$ on the on time ADC of the analog-to-digital conversion module is equal to $$\frac{N}{FOV},$$

and $G_{5temp}$ with reduced amplitude at this time determined as the readout gradient $G_5$.

Figure 8:
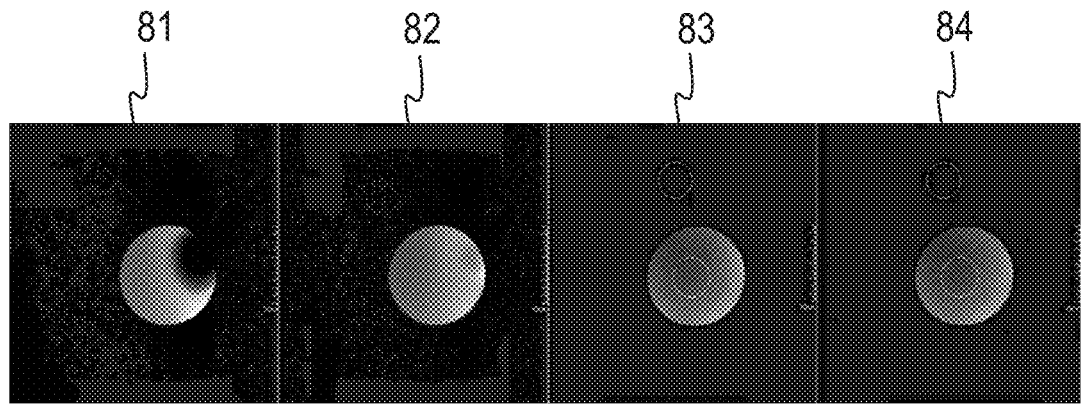
FIG. 8 is a first schematic diagram of the imaging comparison between the embodiment of the present disclosure and conventional art.

FIG. 8 is a first schematic diagram of the imaging comparison between the embodiment of the present disclosure and the conventional usage. Phantom experiments were carried out on 0.35 T magnetic resonance imaging Magnetom C system, and signal-to-noise ratio (SNR) and potential artifacts were studied with 16 head/neck coils. The protocol parameters are as follows: FOV=306/380 mm, BW=815 hz/pixel, matrix=392×512, echo time (TE)/repetition time (TR)=2.6/601 ms (conventional), TA=50 s/(conventional); TE/TR=2.0/487 ms, TA=39 s.

Among these, image 81 and image 83 are the collected images of Trufi sequence using the conventional usage, while sub images 82 and 84 are the collected images of Trufi sequence according to the embodiment of the disclosure. It can be seen that the scanning time of the disclosure is reduced by 20%, the artifact is also reduced, and only a small amount of SNR is sacrificed (less than 3%).

Figure 9:
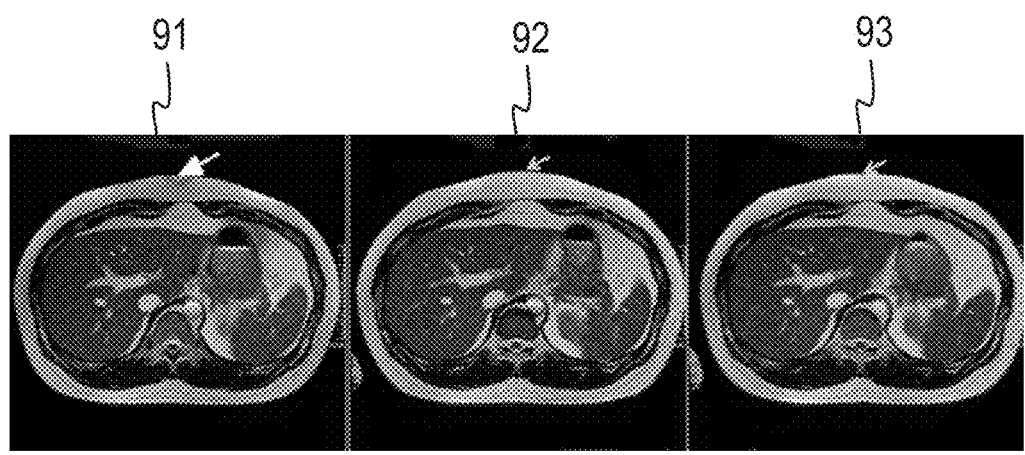
FIG. 9 is a second schematic diagram of the imaging comparison between the embodiment of the present disclosure and the conventional art.

FIG. 9 is a second schematic diagram of the imaging comparison between the embodiment of the present disclosure and conventional usage. This experiment was carried out on 0.35 T Magnetom X system, and abdominal scanning was performed with 6-channel human body matrix coil. The protocol parameters are as follows: FOV=312/380 mm, BW=345 hz/pixel, matrix=378×512, TE/TR=2.5/994 ms (conventional), TA=32 S/(conventional); TE/TR=2.5/930 ms, TA=30 s.

The image 91 is the image acquired by using the conventional Trufi sequence; image 92 is the image acquired by using the Trufi sequence of the disclosure; and image 93 is the image acquired by using the Trufi sequence and strong asymmetric echo. It can be seen that image 93 can reduce the scanning time by 10%, the artifacts can also be reduced, and the image quality will not significantly reduce.

Figure 10:
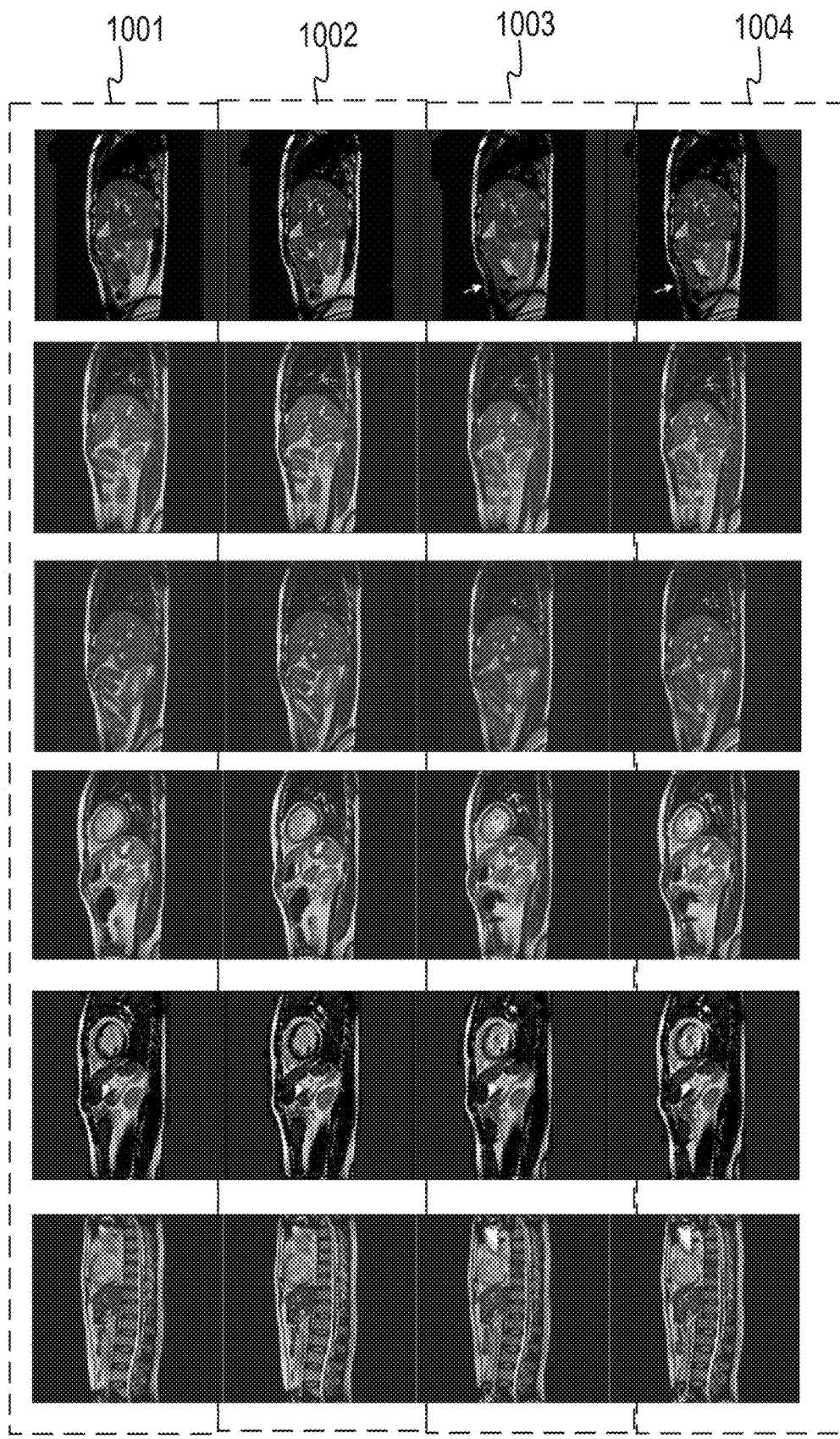
FIG. 10 is a third schematic diagram of the imaging comparison between the embodiment of the present disclosure and the conventional art.

FIG. 10 is a third schematic diagram of the imaging comparison between the embodiment of the present disclosure and the conventional usage. This experiment was carried out on 0.35 T Magnetom X system, and abdominal scanning was performed with 6-channel human body matrix coil. The protocol parameters are as follows: FOV=400/300 mm, slice thickness=6 mm, slice=50; BW=630 hz/pixel, matrix=256×240, TE/TR=2.14/563 ms (conventional), echo spacing=5.1 ms (conventional), TA=40 s (conventional); TE/TR=2.14/480.61 ms, echo interval=4.6 ms (conventional), TA=35 S.

Among these, column 1001 is the acquisition images of Trufi sequence using the embodiment of the present disclosure; column 1002 is the acquisition images using a Trufi sequence and offline noise reduction algorithm of the present disclosure; column 1003 is the acquisition images of a Trufi sequence using existing technology; column 1004 is the acquisition images of a Trufi sequence using the existing technology and the same off-line noise reduction algorithm. It can be seen that the images in the column 1002 is clearer and the dark band in the images of column 1003 are increased.

The disclosure also presents a magnetic resonance imaging device based on the balanced steady-state free precession sequence.

Figure 11:
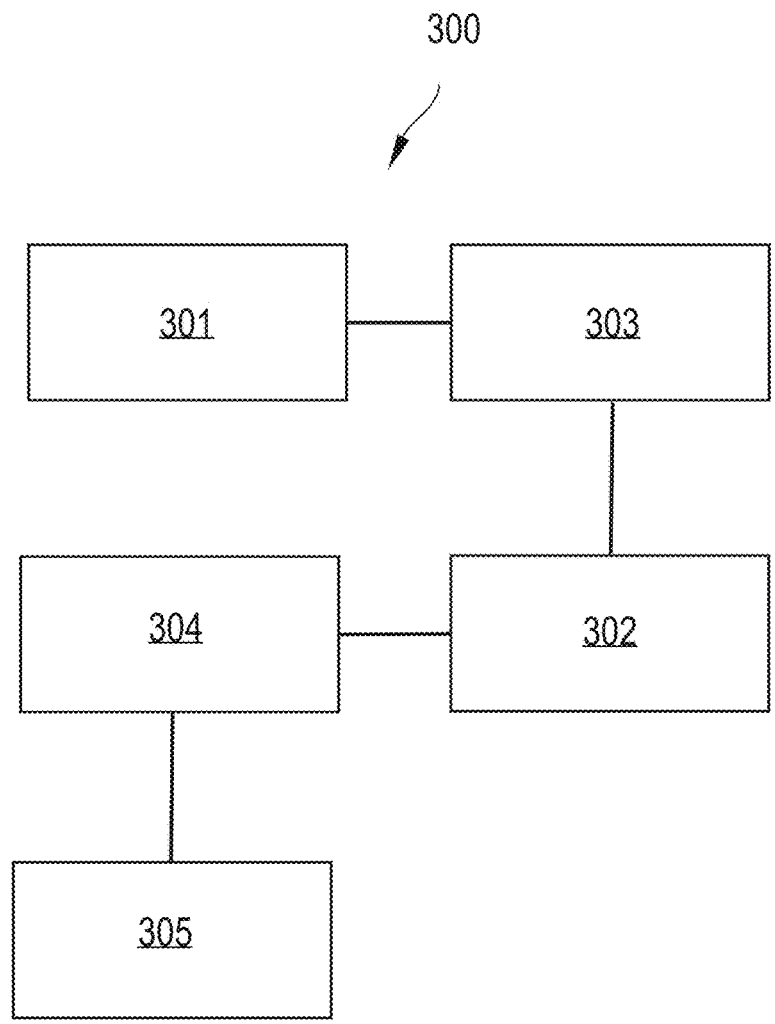
FIG. 11 is a schematic diagram of a magnetic resonance imaging device based on a balanced steady-state free precession sequence according to the embodiment of the present disclosure.

FIG. 11 is a schematic diagram of a magnetic resonance imaging device based on a balanced steady-state free precession sequence according to the embodiment of the present disclosure.

As shown in FIG. 11, the MRI apparatus 300 based on the balanced steady state free precession sequence includes:

A readout gradient determination module or circuitry (which may include one or more processors, processing circuitry, executable instructions, or combinations thereof) 301 for determining a readout gradient including a climb period, a platform period and a descent period;

An analog-to-digital conversion or circuitry (which may include one or more processors, processing circuitry, executable instructions, or combinations thereof) 302 for collecting k-space data after being turned on;

A sequence execution module or circuitry (which may include one or more processors, processing circuitry, executable instructions, or combinations thereof) 303 for performing a balanced steady state free precession sequence, wherein the readout gradient is applied in the readout direction, the analog-to-digital conversion module 302 is turned on during the climbing period, the analog-to-digital conversion module 302 is kept in the on state during the platform period, and the analog-to-digital conversion module 302 is turned off during the descent period;

A conversion module 304 or circuitry (which may include one or more processors, processing circuitry, executable instructions, or combinations thereof) for converting the k-space data collected by the analog-to-digital conversion module 302 into uniform k-space data;

An image generation module 305 or circuitry (which may include one or more processors, processing circuitry, executable instructions, or combinations thereof) for generating a magnetic resonance image based on the uniform k-space data.

In one embodiment, the readout gradient determination module 301, which is used to determine the on time ADC of the analog-to-digital conversion module 302 based on the sampling bandwidth of the reconstruction points in the readout direction; determines the readout gradient $G_5$ with symmetrical shape, where, $$\gamma \int_0^{ADC} G_5 dt = \frac{N}{FOV};$$

$$\mathrm{mod}(\mathrm{time}_{G5}, gradRaster) = 0;$$

where $\gamma$ is Planck constant; N is the number of reconstruction points in the readout direction; FOV is the field of view; $\mathrm{time}_{G5}$ is the time length of the readout gradient $G_5$; and mod is the remainder function; gradRaster is the gradient grid time; dt is the differential of time t; $\int$ is integral symbol.

In one embodiment, when the on time ADC of the analog-to-digital conversion module 302 is 2N times of the gradient grid time gradRaster, the length of the readout gradient $G_5$ is represented as equal to the on time ADC, which is represented as the bottom length of the time profile associated with the isosceles trapezoid; where N is a positive integer.

In one embodiment, when the on time ADC of the analog-to-digital conversion module 302 is not 2N times of the gradient grid time gradRaster;

The readout gradient determination module 301 is used to determine the minimum value $ADC_{virtual}$ of the virtual on time $ADC_{vir}$ of the analog-to-digital conversion module (302), where, $ADC_{vir}$ is greater than the on time ADC of the analog-to-digital conversion module (302), and mod $(ADC_{vir}-ADC, 2*gradRaster)=0$; based on the $$\gamma \int_0^{ADC_{virtual}} G_{5temp} dt = \frac{ADC_{virtual}}{ADC} * \frac{N}{FOV},$$

to determine the temporary readout gradient $G_{5temp}$, where $G_{5temp}$ is represented as the bottom length of the isosceles trapezoid that is equal to $ADC_{virtual}$; the amplitude of the temporary readout gradient $G_{5temp}$ is reduced so that the integral of $G_{5temp}$ in the on time ADC of the analog-to-digital conversion module (302) and is equal to $$\frac{N}{FOV};$$

the $G_{5temp}$ with reduced amplitude is determined as the readout gradient $G_5$; where N is a positive integer.

Based on the above description, the embodiment of the disclosure also provides a control host of a magnetic resonance imaging system.

Figure 12:
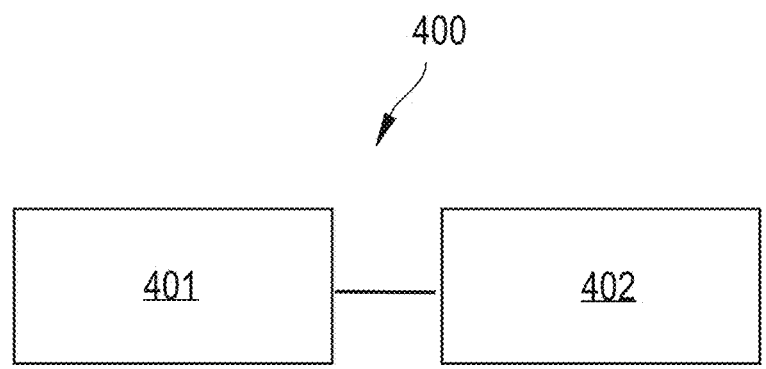
FIG. 12 is a schematic diagram of the control host of the magnetic resonance imaging system according to the embodiment of the disclosure.

FIG. 12 is a structural diagram of a control host of a magnetic resonance imaging system according to an embodiment of the present disclosure.

As shown in FIG. 12, the control host 400 includes a processor 401, a memory 402, and a computer program stored on the memory 402 and capable of running on the processor 401. When the computer program is executed by the processor 401, the magnetic resonance imaging method based on the balanced steady-state free precession sequence is implemented as any one of the items.

Memory 402 can be implemented as EEPROM, Flash memory, PROM and other storage media. The processor 401 may be implemented to include one or more central processing units or one or more field programmable gate arrays, wherein the field programmable gate arrays integrate one or more CPU cores. Specifically, the CPU or CPU core can be implemented as CPU or MCU or DSP, etc.

According to a certain standard application program interface, the k-space data acquisition method of the magnetic resonance imaging system proposed in the embodiment of the disclosure can be written as plug-in programs installed in the magnetic resonance imaging control host, personal computer, mobile terminal, etc., or packaged as application programs for users to download and use by themselves.

The prospective ECG triggering method proposed in the embodiment of the present disclosure can be stored on various storage media through the storage mode of instruction or instruction set storage. These storage media include but are not limited to: floppy disk, CD, DVD, hard disk, flash memory, etc. In addition, the prospective ECG triggering method proposed in the embodiment of the disclosure can also be applied to the storage medium based on NAND flash, such as U disk, CF card, SD card, SDHC card, MMC card, SM card, memory stick, XD card, etc.

The above provides example embodiments of the disclosure, and is not used to limit the protective scope of the disclosure. Any modification, equivalent replacement, improvement, etc. made within the spirit and principle of the disclosure shall be included in the scope of protection of the disclosure.

What is claimed is:

1. A magnetic resonance (MR) imaging method, comprising:
   determining, via one or more processors, a readout gradient time profile including a climbing period, a platform period, and a descent period;
   performing, via one or more processors, a balanced steady state free precession sequence in which the readout gradient time profile is applied in a readout direction;
   activating, via one or more processors, analog-to-digital conversion (ADC) circuitry to collect k-space data during the climbing period, the analog-to-digital conversion circuitry being maintained in an on state during the platform period;
   deactivating, via one or more processors, the ADC circuitry during the descent period;
   converting, via one or more processors, the k-space data collected by the ADC circuitry to uniform k-space data; and
   generating, via one or more processors, an MR image based on the uniform k-space data,
   wherein the act of determining the readout gradient time profile comprises:
      determining, via one or more processor, an on time ADC of the ADC circuitry based on a sampling bandwidth of reconstruction points in the readout direction, such that the readout gradient time profile $G_5$ has a symmetrical shape re presented as:

$$\gamma \int_0^{ADC} G_5 dt = \frac{N}{FOV};$$

$$\mathrm{mod}(\mathrm{time}_{G5}, gradRaster) = 0,$$

wherein:
   $\gamma$ represents Planck's constant,
   N represents a number of reconstruction points in the readout direction,
   FOV represents a field of view,
   $\mathrm{time}_{G5}$ represents a time length of the readout gradient $G_5$,
   mod represents a remainder function, and
   gradRaster represents a gradient grid time.

2. The method of claim 1, wherein:
   when the on time ADC is 2N times the gradient grid time gradRaster, the readout gradient $G_5$ is equal to a time period associated with a bottom length of an isosceles trapezoid that represents a time profile in which the bottom length is equal to the on time ADC, and
   N is a positive integer.

3. The method of claim 1, wherein when the on time ADC is not 2N times of the gradient grid time gradRaster, and the determined readout gradient $G_5$ is determined by:
   determining, via one or more processors, a minimum value $ADC_{virtual}$ of a virtual on time $ADC_{vir}$ of the ADC circuitry,
   wherein $ADC_{vir}$ is larger than the on time ADC of the ADC circuitry, and
   wherein $\mathrm{mod}(ADC_{vir}-ADC, 2*gradRaster)=0$;
   determining, via one or more processors, a temporary readout gradient $G_{5temp}$ based on $$\gamma \int_0^{ADC_{virtual}} G_{5temp} dt = \frac{ADC_{virtual}}{ADC} * \frac{N}{FOV};$$

wherein $G_{5temp}$ is associated with a time profile represented by an isosceles trapezoid having a bottom length equal to $ADC_{virtual}$,
   reducing, via one or more processors, an amplitude of the temporary readout gradient $G_{5temp}$ such that a product of integral of $G_{5temp}$ in the on time ADC and $\gamma$ is equal to $$\frac{N}{FOV};$$

and
   determining, via one or more processors, $G_{5temp}$ with the reduced amplitude as the readout gradient $G_5$,
   wherein N is a positive integer.

4. A magnetic resonance (MR) imaging device, comprising:
   readout gradient determination circuitry configured to determine a readout gradient time profile including a climbing period, a platform period, and a descent period;
   analog-to-digital conversion (ADC) circuitry configured to collect k-space data upon being turned on;
   sequence execution circuitry configured to perform a balanced steady state free precession sequence,
   wherein the readout gradient is applied in the readout direction, the ADC circuitry is activated during the climbing period, and the ADC circuitry is maintained in an on state during the platform period and turned off during the descent period;
   k-space conversion circuitry configured to convert the k-space data collected by the ADC circuitry into uniform k-space data; and
   image generation circuitry configured to generate a magnetic resonance image based on the uniform k-space data,
   wherein the readout gradient determination circuitry is further configured to:
      determine the on time ADC of the ADC circuitry based on a sampling bandwidth of reconstruction points in the readout direction such that the readout gradient time profile $G_5$ has a symmetrical shape represented as:

$$\gamma \int_0^{ADC} G_5 dt = \frac{N}{FOV};$$

$$\mathrm{mod}(\mathrm{time}_{G5}, gradRaster) = 0,$$

and wherein:

γ represents Planck's constant,

N represents a number of reconstruction points in the readout direction,

FOV represents a field of view, time$_{G5}$ represents a time length of the readout gradient G$_5$, mod represents a remainder function, and gradRaster represents a gradient grid.

5. The MR imaging device of claim 2, wherein when the on time ADC is 2N times the gradient grid time gradRaster, the readout gradient G$_5$ is equal to a time period associated with a bottom length of an isosceles trapezoid that represents a time profile in which the bottom length is equal to the on time ADC, and wherein N is a positive integer.

6. The MR imaging device of claim 2, wherein when the on time ADC is not 2N times of the gradient grid time gradRaster, the determined readout gradient G$_5$ is determined by:

determining, via one or more processors, a minimum value ADC$_{virtual}$ of a virtual on time ADC$_{vir}$ of the ADC circuitry, wherein ADC$_{vir}$ is larger than the on time ADC of the ADC circuitry, and wherein mod(ADC$_{vir}$−ADC, 2*gradRaster)=0;

determining, via one or more processors, a temporary readout gradient G$_{5temp}$ based on $$\gamma \int_0^{ADC_{virtual}} G_{5temp} dt = \frac{ADC_{virtual}}{ADC} * \frac{N}{FOV},$$

wherein G$_{5temp}$ is associated with a time profile represented by an isosceles trapezoid having a bottom length is equal to ADC$_{virtual}$, reducing, via one or more processors, an amplitude of the temporary readout gradient G$_{5temp}$ such that a product of integral of G$_{5temp}$ in the on time ADC and γ is equal to $$\frac{N}{FOV},$$

determining, via one or more processors, G$_{5temp}$ with the reduced amplitude as the readout gradient G$_5$, wherein N is a positive integer.

7. A non-transitory computer-readable storage medium having instructions stored thereon that, when executed a processor identified with a magnetic resonance (MR) imaging device, cause the MR imaging device to:

determine a readout gradient time profile including a climbing period, a platform period, and a descent period;

perform a balanced steady state free precession sequence in which the readout gradient time profile is applied in a readout direction;

activate analog-to-digital conversion (ADC) circuitry to collect k-space data during the climbing period, the ADC circuitry being maintained in an on state during the platform period;

deactivate the ADC circuitry during the descent period;

convert the k-space data collected by the ADC circuitry to uniform k-space data; and generate an MR image based on the uniform k-space data, wherein the readout gradient time profile is determined by determining an on time ADC of the ADC circuitry based on a sampling bandwidth of reconstruction points in the readout direction, such that the readout gradient time profile G$_5$ has a symmetrical shape represented as:

$$\gamma \int_0^{ADC} G_5 dt = \frac{N}{FOV};$$

mod(time$_{G5}$, gradRaster) = 0, wherein:

γ represents Planck's constant,

N represents a number of reconstruction points in the readout direction,

FOV represents a field of view, time$_{G5}$ represents a time length of the readout gradient G$_5$, mod represents a remainder function, and gradRaster represents a gradient grid time.

8. The non-transitory computer-readable storage medium of claim 7, wherein when the on time ADC is 2N times the gradient grid time gradRaster, the readout gradient G$_5$ is equal to a time period associated with a bottom length of an isosceles trapezoid that represents a time profile in which the bottom length is equal to the on time ADC, and wherein N is a positive integer.

9. The non-transitory computer-readable storage medium of claim 7, wherein when the on time ADC is not 2N times of the gradient grid time gradRaster, the instructions, when executed by the processor, further cause the MR imaging device to determine the readout gradient G$_5$ by:

determining a minimum value ADC$_{virtual}$ of a virtual on time ADC$_{vir}$ of the ADC circuitry, wherein ADC$_{vir}$ is larger than the on time ADC of the ADC circuitry, and wherein mod(ADC$_{vir}$−ADC, 2*gradRaster)=0;

determining a temporary readout gradient G$_{5temp}$ based on $$\gamma \int_0^{ADC_{virtual}} G_{5temp} dt = \frac{ADC_{virtual}}{ADC} * \frac{N}{FOV},$$

wherein G$_{5temp}$ is associated with a time profile represented by an isosceles trapezoid having a bottom length is equal to ADC$_{virtual}$, reducing an amplitude of the temporary readout gradient G$_{5temp}$ such that a product of integral of G$_{5temp}$ in the on time ADC and γ is equal to $$\frac{N}{FOV},$$

and determining G$_{5temp}$ with the reduced amplitude as the readout gradient G$_5$, wherein N is a positive integer.

* * * * *